United States Patent
Balluchi et al.

(10) Patent No.: US 8,543,787 B2
(45) Date of Patent: Sep. 24, 2013

(54) NON-VOLATILE MEMORY CIRCUIT, SYSTEM, AND METHOD

(75) Inventors: Daniele Balluchi, Vimercate (IT); Graziano Mirichigni, Pietracamela (IT)

(73) Assignee: Micron Technology, Inc., Boise, ID (US)

( * ) Notice: Subject to any disclaimer, the term of this patent is extended or adjusted under 35 U.S.C. 154(b) by 1560 days.

(21) Appl. No.: 12/148,521

(22) Filed: Apr. 17, 2008

(65) Prior Publication Data
US 2008/0263302 A1 Oct. 23, 2008

(30) Foreign Application Priority Data
Apr. 17, 2007 (IT) .............................. MI2007A0787

(51) Int. Cl.
G06F 12/00 (2006.01)
(52) U.S. Cl.
USPC .................................. 711/167; 711/E12.001
(58) Field of Classification Search
USPC .......................................... 711/167, E12.001
See application file for complete search history.

(56) References Cited

U.S. PATENT DOCUMENTS
2007/0011405 A1* 1/2007 Adusumilli ................... 711/122
* cited by examiner Primary Examiner — Yong Choe
(74) Attorney, Agent, or Firm — Schwegman, Lundberg & Woessner, P.A.

(57) ABSTRACT

A non volatile memory device includes a first buffer register configured to receive and store the data to be stored into the memory device provided via a memory bus. A command window is activatable for interposing itself for access to a memory matrix between the first buffer element and the memory matrix. The command window includes a second buffer element that stores data stored in or to be stored into a group of memory elements. A first data transfer means executes a first transfer of the data stored in the second buffer register into the first buffer register during a first phase of a data write operation started by the reception of a first command. A second data transfer means receives the data provided by the memory bus and modifies, based on the received data, the data stored in the first buffer register during a second phase of the data write operation started by the reception of a second command. The first transfer means execute a second transfer of the modified data stored in the first buffer register into the second buffer register during a third phase of the data write operation. The second transfer is executed in response to the reception of a signal received by the memory bus together with the second command.

20 Claims, 6 Drawing Sheets

NON-VOLATILE MEMORY CIRCUIT, SYSTEM, AND METHOD

PRIORITY CLAIM

This application claims priority from Italian patent application No. MI2007A000787 filed Apr. 17, 2007, which is incorporated herein by reference.

TECHNICAL FIELD

Embodiments of the present invention generally relate to the electronic field. Particularly, embodiments of the present invention relate to non-volatile memory devices of the Double Data Rate (DDR) type, and to methods for accessing, particularly for writing, these memories.

BACKGROUND

DDR Synchronous Dynamic Random Access Memories (DDR SDRAMs) are known. A DDR SDRAM is a type of volatile memory that is extensively used as system memory for the computers, for example for the Personal Computers (PC).

Unlike other types of random access memories, a SDRAM memory is provided with a synchronous interface. Thus, the SDRAM memory requires the presence of a clock signal that is used for driving a finite state machine for timing the instructions received at control inputs of the memory. Thanks to this timing, an SDRAM memory is capable of managing operations that are more complex compared to those manageable by means of non-synchronous random access memories, such as a dynamic random access memory (DRAM).

The SDRAM memories are further characterized by having a high potential access band because each reading operation may interest several thousands of information bits.

For further improving the performances offered by such a memory type, a Double Data Rate (DDR) interface has been developed. Thanks to the presence of the double rate interface, the memory is capable of executing two reading or writing transfers for each cycle of the clock signal (particularly, one in correspondence of the rising fronts of the clock signal, and one in correspondence of the falling fronts). Compared to the other SDRAM memories, the minimum read/write unit (i.e., the minimum quantity of data that is read/written during an access to the memory) is doubled: in a DDR SDRAM memory, each single access refers to at least two consecutive memory words. This technique allows the doubling of the transfer speed of the data without having to increase the working frequency of the memory bus. In other words, the clock signal of a DDR SDRAM is exploited more with respect to the case of a single rate SDRAM memory, because the "real" transfer frequency is twice the clock frequency.

As it is known to the skilled technicians, the Joint Electron Device Engineering Council (JEDEC) has established standards regarding the characteristics and the specifics of the DDR SDRAMs. Moreover, the JEDEC has provided several specific protocols for the management of the operations required for the use and operation of such memories.

Seeing the numerous advantageous characteristics of the DDR SDRAM memories, it would be desirable to have a non-volatile counterpart thereof (capable of maintaining the information even in absence of an electrical supply), i.e., a Non-Volatile DDR Memory (DDR NVM), to be coupled thereto. In this way, it would be possible to have performances comparable to that offered by the DDR SDRAM memories in all those application fields that require the saving of the information in a permanent way, but that, at the same time, require short response times. Moreover, in certain applications in which the available resources, intended as both available power and available silicon area within the chip integrating the memories, are limited, it would be highly desirable that the DDR SDRAM memories and the DDR NVM memories use the same interfaces and the same communication buses as much as possible. For example, in order to increment the speed performances of mobile terminals for telecommunications, it would be advantageous to substitute the non-volatile memories of the classic type used for storing data with DDR NVM memories, reducing the access times to the memory.

A substantial difference occurring between the non-volatile memories and the volatile memories consists in the different way the data are written (program phase). Particularly, the program phase of a non-volatile memory is usually more complex and requires a higher amount of time. For example, in order to program a flash non-volatile memory it is necessary to apply a series of (voltage or current) pulses to the memory cells to be programmed, and, after the application of each pulse, the programming state of the memory cells is usually verified. This requires a greater amount of time compared to that necessary for programming the same quantity of data in a volatile memory.

Because of the major difference occurring between the DDR NVM memories and the DDR SDRAM memories, it would be thus necessary to differentiate the communication buses and at the same time follow protocols for the management of the operations that are greatly different to each others. However, such a solution is expensive in terms of resources, and thus not optimized to be implemented for mobile terminals for telecommunication devices (and in general for the devices having limited resources).

SUMMARY

An embodiment of the present invention proposes a non volatile memory device. Such memory device is adapted to be coupled to a memory bus adapted to provide data to be stored in the memory device and commands to be executed by the memory device. The memory device includes a memory matrix that includes memory elements adapted to memorize or store the data in a non-volatile way. At least a first buffer register is configured to receive and memorize in a volatile way the data to be stored into the memory device provided by the memory bus. A command window is activatable for interposing itself for the access to the memory matrix. Between the at least one first buffer element and the memory matrix, the command window includes at least one second buffer element adapted to store in a volatile way data stored in or to be stored into a group of memory elements. The memory device further includes first data transfer means adapted to execute a first transfer of the data stored in the at least one second buffer register into the at least one first buffer register during a first phase of a data write operation in the memory device started by the reception of a first command. A second data transfer means is adapted to receive the data provided by the memory bus and to modify, based on the received data, the data stored in the at least one first buffer register during a second phase of the data write operation started by the reception of a second command. The first transfer means are adapted to execute a second transfer of the modified data stored in the at least one first buffer register into the at least one second buffer register during a third phase of the data write operation, the second transfer being executed in response to the reception of a signal received by the memory bus together with the second command.

BRIEF DESCRIPTION OF THE DRAWINGS

The invention itself, as well as further features and advantages thereof will be best understood by reference to the following detailed description of embodiments thereof, given purely by way of a non-restrictive indication, to be read in conjunction with the accompanying drawings. In this respect, it is expressly intended that the figures are not necessarily drawn to scale and that, unless otherwise indicated, they are merely intended to conceptually illustrate the structures and procedures described herein. Particularly.

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
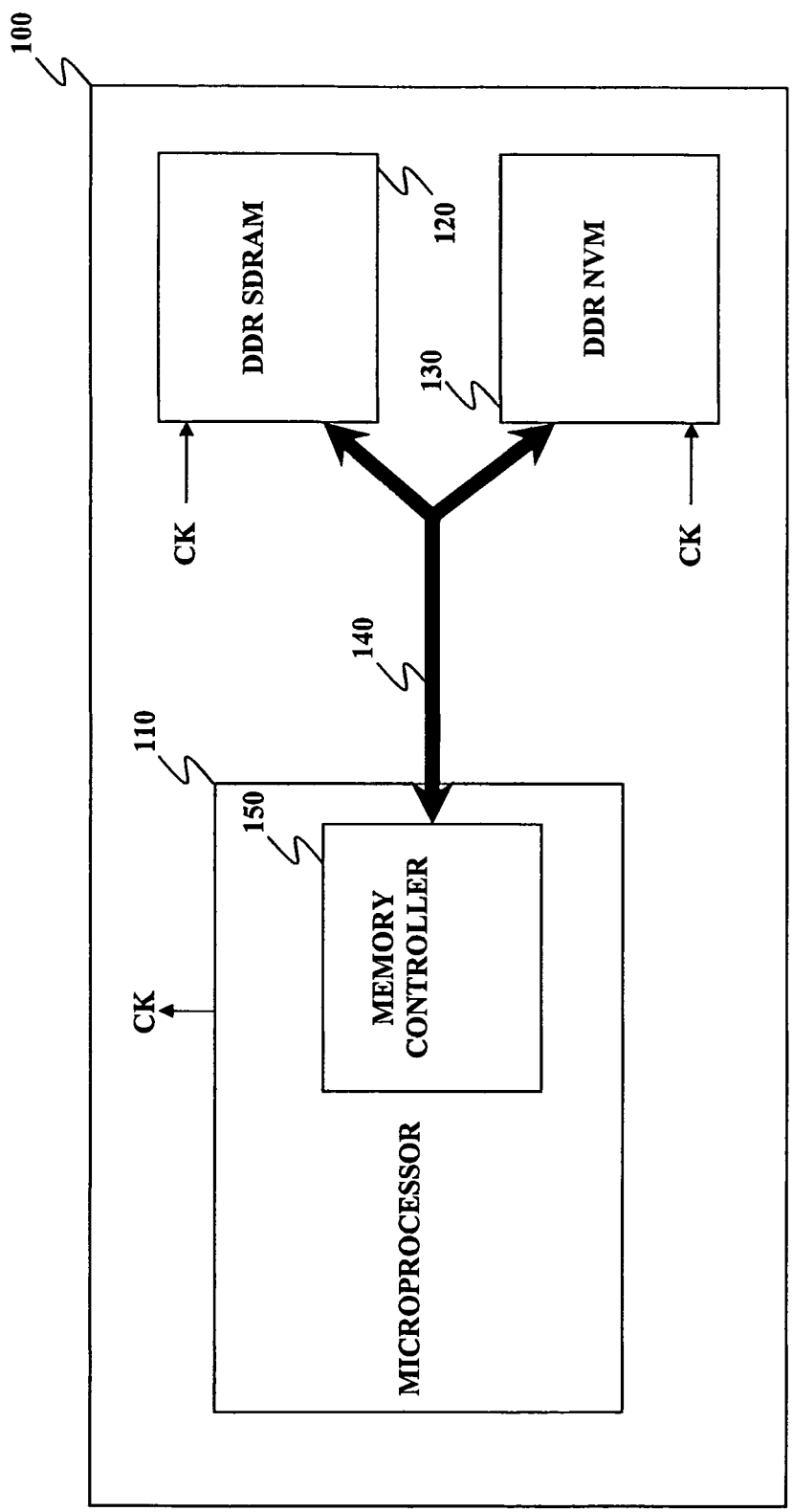
FIG. 1 is a schematic of an electronic system i according to an embodiment of the present invention.

With reference to the FIG. 1, several of the main components of an electronic system 100 according to an embodiment of the present invention are schematically illustrated.

The electronic system 100 may be part of a greater system (not shown in the figure) making for example reference to the field of mobile devices for telecommunication the electronic system 100 may be included in a cellular phone.

The electronic system 100 includes a processor 110, a volatile memory 120 and a non-volatile memory 130. The volatile memory 120 may for example form the system memory for the operation of the cellular phone, and the non-volatile memory 130 may instead form the mass memory for the storing of information that need to be maintained even in absence of power supply of the cellular phone (for example, the firmware used by the phone processors, the application programs and the personal information of the phone user). The processor 110 is coupled with the volatile memory 120 and the non-volatile memory 130 by means of a common communication bus 140, in the following referred to as memory bus. Particularly, the memory bus 140 includes a data bus, onto which the data to be stored into the memories 120, 130 or the data read therefrom are sent, and a command and address bus, that is used by the processor 110 for providing the addresses for specifying the locations to be accessed in the memories 120, 130, and the commands that have to be executed by the memories.

The volatile memory 120 comprises a DDR SDRAM memory, while the non-volatile memory 130 comprises a DDR NVM memory, for example a double data rate flash memory.

A clock signal CK is generated by the processor 110, and is provided both to the volatile memory 120 and the non-volatile memory 130 for timing their operation.

The function of the processor 110 is to control the operations of the electronic system 100. In particular, the processor 110 includes a memory controller 150 adapted to generate and manage a data, addresses and commands that flow on the memory bus 140 for being sent/received by the processor 110 and by the memories 120, 130.

The memory controller 150 comprises logic circuits adapted to manage the read and write operations of the DDR SDRAM memory 120 and of the DDR SDRAM memory 130. Furthermore, the memory controller 150 manages the refresh operations of the DDR SDRAM memory 120, necessary for maintaining the data stored therein. Should a constant update of the data stored in the DDR SDRAM memory 120 not performed, such data would be lost. Indeed, because of the presence of unavoidable leakage currents, the memory elements of the DDR SDRAM memory 120, i.e., capacitors adapted to store electrical quantities depending on the datum, tend to discharge within a certain time period (according to the JEDEC standards, within 64 milliseconds).

Figure 2:
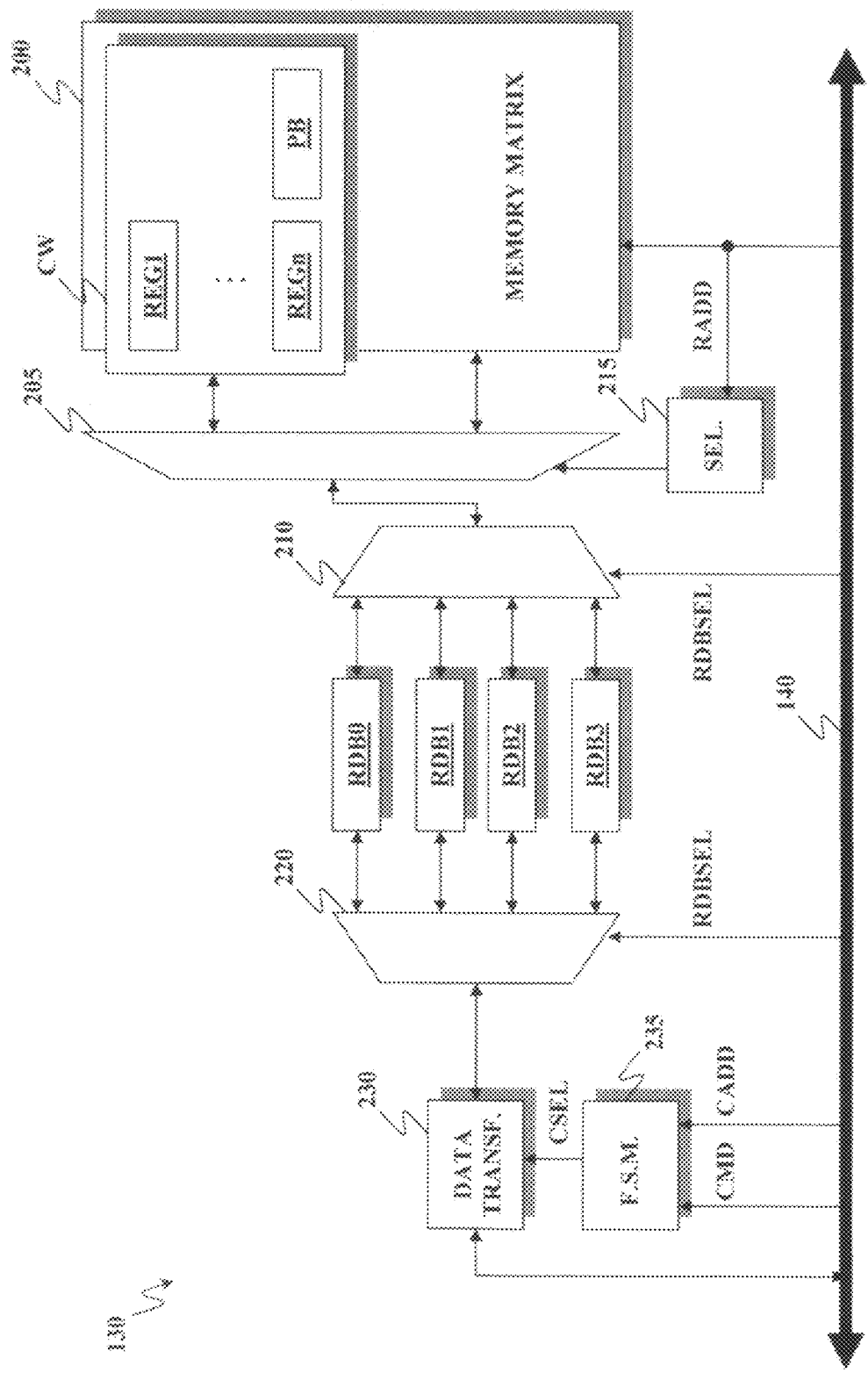
FIG. 2 is a functional block diagram of a DDR NVM memory included in the electronic system of FIG. 1.

Making now reference to the FIG. 2, the structure of the DDR NVM memory 130 is illustrated in greater detail, in terms of functional blocks.

As will be more clear in the following description, some of the significant elements that constitute the DDR NVM memory 130 are the same that are included in the DDR SDRAM memory 120. Thanks to these similarities, exploiting a substantial single protocol for the management of the operations of both the memories is possible.

The DDR NVM memory 130 comprises a memory matrix 200, which includes memory elements adapted to the storing of the data in a non-volatile way. For example, the memory matrix 200 is a matrix of flash memory elements, whose memory elements comprise floating gate MOS transistors that can be programmed by varying the threshold voltage by injecting/removing electrical charges into/from the floating gate. For the purpose of simplifying the present description, it is supposed that within the memory matrix 200 are included not only the memory elements, but also the command circuits that usually are present within a non-volatile memory, such as the decoders, the selectors and the program and reading circuits.

The memory matrix 200 is adapted to receive from the memory bus 140 a row address RADD, and to provide the contents of the memory elements of the row of the matrix 200 corresponding to the row address RADD to a first terminal of a selector 205. In a similar way, the memory matrix 200 is adapted to receive data from the first terminal of the selector 205, and to memorize them into the memory elements of the row of the memory matrix 200 corresponding to the row address RADD. The selector 205 includes a second terminal coupled with a functional block denoted with the term "command window", and identified with the reference CW, whose purpose and operation will be described description, The selector 205 further comprises a third terminal coupled with an input/output terminal of a further selector 210 and a control terminal coupled with a selection block 215, which is adapted to receive from the memory bus 140 the row address RADD.

Based on the row address RADD, the selection block 215 drives the selector 205 through the control terminal, for establishing a selective connection between the third terminal of the selector 205 and a selected terminal between the first and second terminals of the selector 205. In this way, the selector 205 is operable to selectively connect the memory matrix 200 or the command window CW with the selector 210 according to the row address RADD.

The selector 210 includes four further terminals, each one connected to a corresponding volatile row register RDBi (i=0, 1, 2, 3), and a control terminal, adapted to receive from the memory bus 140 register selection signals RDBSEL. According to the register selection signals RDBSEL values, the selector 210 is capable of selecting a row register RDBi and connecting it to the input/output terminal (i.e., coupling it with the selector 205). The dimension of each row register RDBi depends on the number of memory elements that form the generic row of the memory matrix 200: each row register RDBi is in fact capable of memorizing or storing the information corresponding to all the memory elements of a row of the memory matrix 200.

In a similar manner, each row register RDBi is coupled with a corresponding terminal of a further selector 220, which includes an input/output terminal connected to a data transfer block 230 and a control terminal adapted to receive from the memory bus 140 the register selection signals RDBSEL. According to the register selection signals RDBSEL values, the selector 220 is capable of selecting a row register RDBi and connecting it to the input/output terminal (i.e., coupling it with the data transfer block 230).

The data transfer block 230 has a terminal connected to the memory bus 140 for receiving information from the outside, for example, data to be stored in the memory matrix 200 or for outputting on the memory bus 140 information stored in the device, for example, data read from the memory matrix, and a terminal for receiving a drive signal CSEL generated by a finite state machine 235, which receives the clock signal CK and, from the memory bus 140, a column address CADD. The finite state machine 235 further comprises a command interface, adapted to receive from the memory bus 140 commands CMD sent by the memory controller 150, and instruct the various components of the DDR NVM memory 130 according to the received commands CMD.

According to the operation that the DDR NVM memory 230 is executing, the data transfer block 230 may receive the content of a row register RDBi selected by the selector 220, and transfer the data onto the memory bus 140, or may provide a new content to the selected row register RDBi using data coming from the memory bus 140. Since each row register RDBi includes a quantity of data equal to that storable using all the memory elements of a row of the memory matrix 200, and since a read operation or a write operation generally regards only a portion of such quantity, the transfer of data from the memory bus 140 and the selected row register RDBi (and vice versa) is managed by the finite state machine 235, which defines for each clock interval which portion(s) of data are to be taken from the selected row register RDBi or to be provided thereto according to the column address CADD and the command CMD.

The operations carried out by the DDR NVM memory 230 during the reading of the data stored in the memory matrix 200 will be described in the following, according to a first reading modality, which does not make use of the command window CW.

According to this first modality, the reading operations are advantageously executed in a way similar to that defined by the JEDEC protocol for the DDR SDRAM memories.

Particularly, the reading operation consists of distinct phases: a first phase, denoted "row opening phase", followed by one or more "read access phases". The row opening phase is started in response to the sending of a corresponding command CMD provided by the memory controller 150 through the command bus of the memory bus 140, and denoted "ACTIVE". In the same way, each read access phase is started in response to the sending of a corresponding command CMD provided by the memory controller 150 through the command bus of the memory bus 140, and denoted "READ".

During the row opening phase, the row address RADD corresponding to the row of the memory matrix 200 including the memory elements whose content has to be read is sent on the memory bus 140. The row address RADD is thus provided both to the memory matrix 200 and to the selection block 215. In response to the reception of the row address RADD, the memory matrix 200 carries out internal reading operations, providing the data stored in the memory elements corresponding to the addressed row to the first terminal of the selector 205. Then, the selection block 215 drives the selector 205 for selecting the memory matrix 200 (this point will be more clear in the following description). In this way, the data read from the memory matrix 200 are provided to a row register RDBi selected by means of the register selection signals RDBSEL. The decision on which row register RDBi has to be selected is carried out by the memory controller 150 The selection rules of the row register RDBi may depend on several factors, such as the quantity of row registers RDBi that have not yet been used and the possibility of optimizing the memory performances as much as possible.

As a consequence, at the end of the row opening phase, the data read from the selected row of the memory matrix 200 is stored in the row register RDBi selected by the memory controller 150.

Each read access phase consists instead in the transfer of the data previously stored in the row register RDBi toward the memory bus 140. As already anticipated in the previous, the reading operation regards one or more portions of the data corresponding to the whole row, where each portion is identified by a corresponding column address CADD. As a consequence, during each read access phase, the selector 220 is driven by means of the register selection signals RDBSEL for providing the content of the row register RDBi used in the preceding row opening phase to the transfer block 230, which outputs the selected portions of the data on the memory bus 140 according to the column address CADD (by means of a proper driving carried out by the finite state machine 235).

The procedure that has been previously described is similar to that used for reading data stored in the DDR SDRAM memories. This is possible because the reading times of a non-volatile memory, for example, a flash memory, may be of the same order of magnitude of those employed by a SDRAM memory.

The presence of more than one row register RDBi allows further speeding up of the reading operations, since it is possible to carry out a read access phase using a row register RDBi and at the same time carry out a new row opening phase using another register (in other words, it is possible to operate according to a "pipelined" mode).

While the reading procedure previously described does not move away from that normally used for the reading of the DDR SDRAM memories, the same considerations cannot be applied to the writing.

Indeed, according to the protocol of the DDR SDRAM memories, a writing operation for a DDR SDRAM is composed by the following phases: a first row opening phase, equivalent to that previously described for the reading, followed by one or more phases denoted "write access phase", and lastly a phase denoted "row closure phase". Even in that case, the row opening and write access phases are started in response to the sending of corresponding commands CMD provided by the memory controller 150 through the command bus of the memory bus 140: particularly, the row opening phase is started by an "ACTIVE" command, while each write access phase is started by a corresponding "WRITE" command.

According to an embodiment of the present invention, such protocol, conceived for the DDR SDRAM, is used for interacting with the DDR NVM memory 130.

During the row opening phase, the data corresponding to the row of the memory matrix 200 selected by means of the row address RADD are stored into a row register RDBi.

At this point, during each write access phase, portions of said data stored in the row register RDBi are replaced with new data coming from the memory bus 140. This operation is managed by the finite state machine 235 using the column address CADD, in a similar way to that described for the reading operation.

The last phase, i.e., the row closure phase, comprises transferring the content of the row register RDBi, which has been modified during the write access phases, to the memory matrix 200, which provides for updating the data corresponding to the selected row with the content of the row register RDBi by means of internal write operations.

According to the protocol of the DDR SDRAM memories, the row closure phase may be activated in two different ways. Particularly, the row closure phase may be activated in an explicit way, by means of the sending of a command CMD denoted "PRECHARGE" (i.e., in the same way as for the row opening and write access operations), or may be activated in an automatic way. For this purpose, it is exploited a predetermined value of a signaling bit, sent together with the last WRITE command.

However, the Applicant has observed that this procedure is not efficient for the non-volatile memories.

Indeed, supposing that the memory matrix 200 includes memory elements of the flash type, the row closure phase would require a high quantity of time, since the updating of the data corresponding to the selected row with the content of the row register RDBi requires the execution of a writing phase composed by many (and expensive, in terms of time) operations (in the case of the flash memories, the applications of a non-negligible number of programming pulses).

Having a row closure phase that is excessively expensive in terms of time, problems regarding the management of the row registers RDBi may occur. Indeed, during a row closure phase that involves a determined row register RDBi, it may be necessary to use the same row register RDBi for executing a row opening phase of another writing operation (for example, in case the remaining row registers RDBi are occupied). As a consequence, in order not to prematurely interrupt the row closure phase of the first operation and not to lose data that are not still transferred into the memory matrix 200, all the various schedules should be taken into account in an accurate ways, with a consequent increase in the complexity of the operations to be managed. In this case, it would be necessary to modify the protocol, and/or add additional control circuits.

A further problem that may arise using this writing procedure is connected to the different granularity that a DDR NVM memory may have with respect to a DDR SDRAM memory. Indeed, while in a DDR SDRAM memory it is possible to write data with a granularity of bytes, this is usually not possible for a DDR NVM memory. For example, in a flash memory the granularity is typically much higher than a single byte, since the modification of even a single data byte may request the preliminary erasure of a whole memory page. As a consequence, while for a DDR SDRAM it is possible to execute a row closure phase for updating a little portion of the selected row of the memory matrix 200, for a DDR NVM memory it is necessary to wait until the portion of the row to be updated is sufficiently large.

For the purpose of resolving the above mentioned problems, during a writing operation on the DDR NVM memory, the command window CW is used.

The command window CW includes a plurality of registers REGj (j=1, 2, ..., n) formed by volatile memory elements that are used for the purpose of receiving data to be written into, and commands to be executed onto, the memory matrix 200.

Particularly, each register REGj may absolve the function of tracking the type of operation that is in execution (for example, programming or erasing), or may memorize the address RADD of the location(s) of the memory matrix 200 corresponding to the memory elements to which the operation defined by the received command CMD is addressed. Furthermore, the registers REGj may be employed for storing the data to be written into the memory elements of the memory matrix 200. In addition, the command window CW may include one or more registers denoted "program buffer" PB, usable in case the data to be written into the memory matrix 200 in a single access are numerous.

Figure 3:
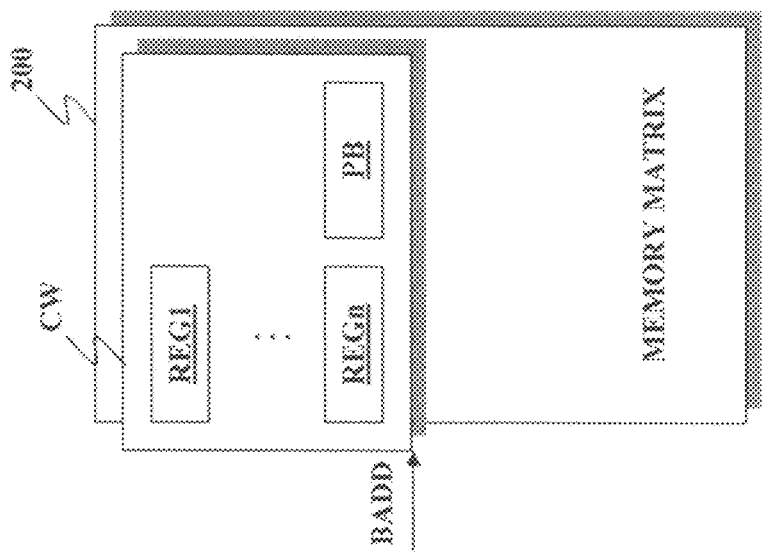
FIG. 3 shows two examples of how the memory space defined by a command window of the DDR NVM memory of FIG. 2 can overlap the memory space defined by a memory matrix included in the memory of FIG. 2.
Figure 3:
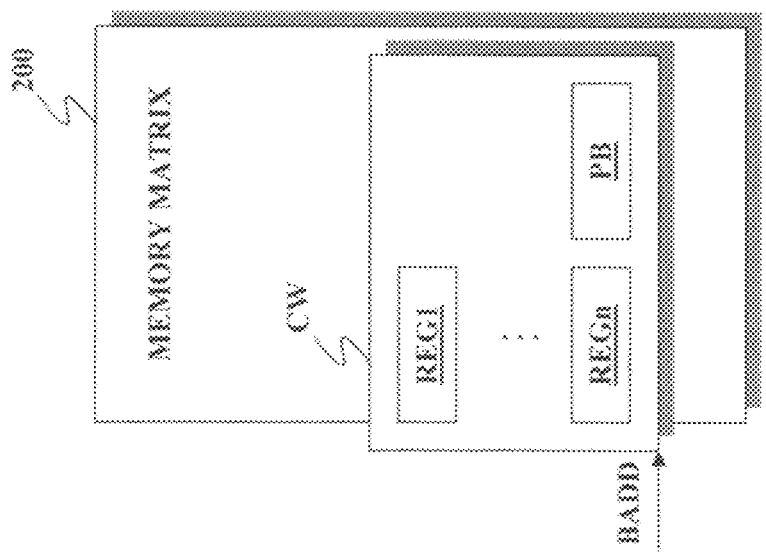

As can be observed making reference to the FIG. 3, the command window CW is associated with a memory space that, if enabled, overlaps the memory space associated with the memory elements of the memory matrix 200. In particular, when the command window CW is activated (for example, by the memory controller 150), a base address BADD is set, indicative of the position of the memory space associated with the command window CW within the whole memory space of the memory matrix 200. The base address BADD corresponds to the particular row address RADD of the memory matrix 200 starting from which the command window CW overlaps to the memory space associated with the memory matrix 200. The extent of such overlap depends on the size of the memory space associated with the command window CW, which depends, in turn, on the number of registers REGj forming the command window and by the size of the program buffer PB. As it is shown in FIG. 3, varying such base address BADD it is possible to bring the command window CW to overlap to different zones of the memory space associated with the memory matrix 200.

When the memory matrix 200 is accessed for a writing operation, if the selected row address RADD is comprised within the memory space of the command window CW, the various phases that compose the writing operation interest the content of the registers REGj of the command window CW, instead of the content of the memory elements of the memory matrix 200.

For this purpose, the selection block 215 checks the row address RADD and compares it with the base address BADD. If the row address RADD corresponds to the memory space defined by the command window CW, the selection block 215 drives the selectors 205 in such a way to connect the command window CW with the input/output terminal of the selector 210, excluding thus the access to the memory matrix 200.

The writing operation that makes use of the command window CW starts in a way similar to that of the previous operations described in the present description, i.e., with a row opening phase started by the reception of an ACTIVE command sent by the memory controller 150. The only difference is that the selected row register RDBi is filled with the content of one or more registers of the command window CW, instead of with the content of a row of the memory matrix 200.

Afterward, one or more write access phases are performed, each started by the reception of a corresponding WRITE command sent by the memory controller 150, and having the purpose of modifying portions potentially different of the content of the selected row register RDBi according to the received column address CADD.

According to an embodiment of the present invention, the writing operation ends with a phase denoted "closure and transfer phase" started by the reception of a "FLUSH" command sent by the memory controller 150.

In order to start the closure and transfer phase, the memory controller 150 sends onto the memory bus 140, together with the last command WRITE of the sequence, the command FLUSH, which signals to the DDR NVM 130 to transfer the content of the selected row register RDBj to the command window CW—particularly, to one or more selected registers REGj of the command window, or to the program buffer PB. Thus, according to an embodiment of the present invention, such FLUSH command is issued contemporaneously with the last WRITE command of the sequence. In greater detail, for the FLUSH command it may used a bit, denoted flag bit FG, that is sent onto the address and command bus of the memory bus 140 contemporaneously with the last WRITE command of the sequence.

The flag bit FG may be activated every time the content of the selected row register RDBi has to be transferred to the command window CW.

In greater detail, while during each writing access phase the data transfer block 230 receives groups of bits that are used for updating portions of the content of the selected row register RDBi (according to the received column addresses CADD), the closure and transfer phase is composed by two sub-phases: a first sub-phase equal to a normal writing access phase, during which the data transfer block 230 receives a group of bits sent with the last WRITE command of the sequence, to be used for updating a last portion of the content of the row register RDBi, and a second sub-phase in which, having retrieved the flag bit FG sent with the last WRITE command, the content of the selected row register RDBi is transferred to the command window CW.

Advantageously, the flag bit FG, that instructs the memory 130 on the necessity to automatically execute a transfer of the content of the selected row register into the command window, is transferred in the same way as, according to the protocol for the DDR SDRAM memories, it is transferred the flag bit that instructs the DDR SDRAM memory of the necessity to automatically execute the row closure operation after a last WRITE or READ command has been received. This allows to substantially exploit the same protocol provided for the DDR SDRAM memories even for interact with the DDR NVM memory.

Figure 4:
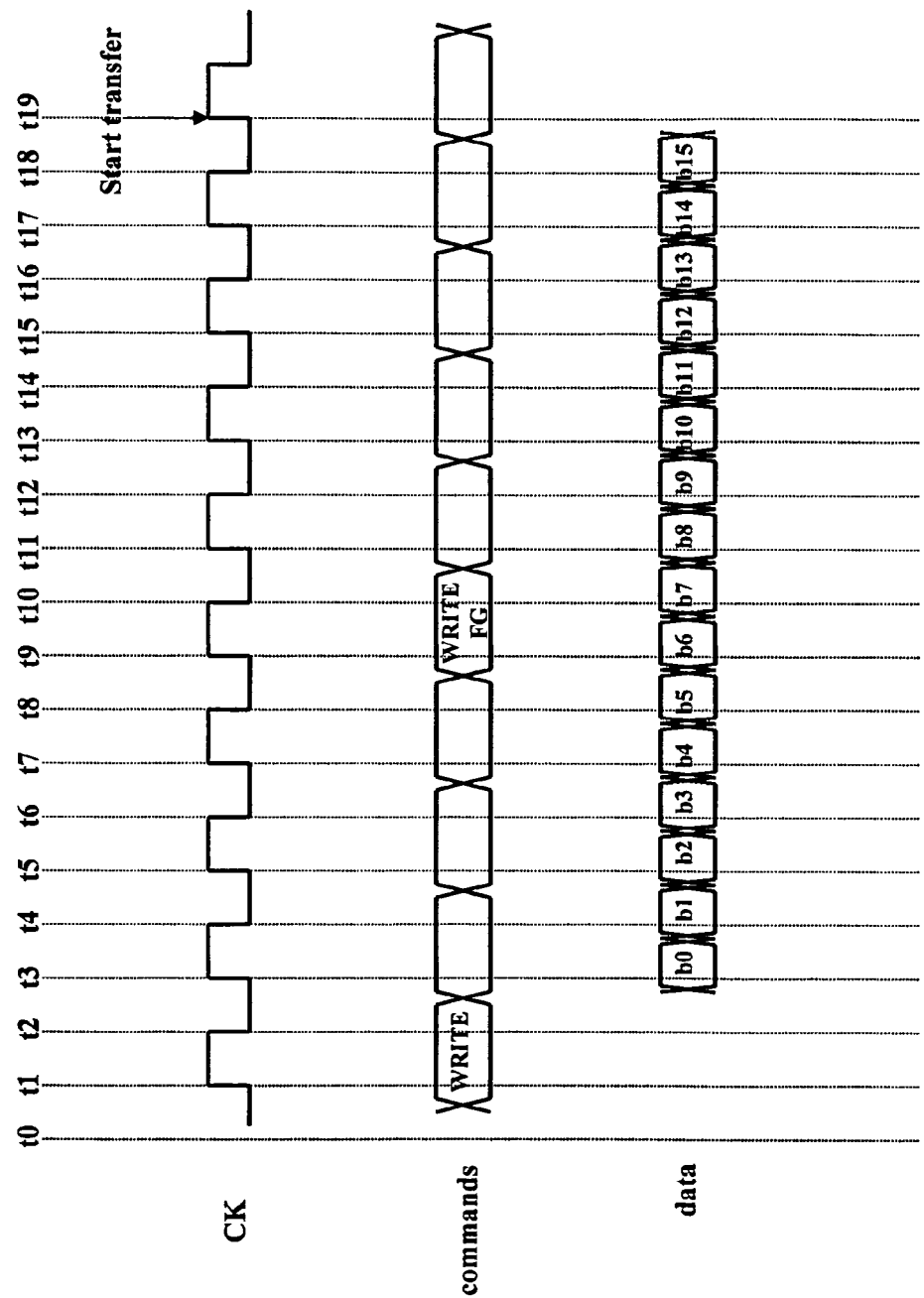
FIG. 4 is a diagram that illustrates the evolution in time of the data and commands that flow on a memory bus of the DDR NVM memory during a write operation according to an embodiment of the present invention.

An example of how a writing operation making use of the command window CW is carried out according to an embodiment of the present invention is shown in FIG. 4.

In particular, FIG. 4 shows a diagram that illustrates the evolution in time of the data and commands that flows on the memory bus 140 when the DDR NVM memory 130 carries out a writing operation composed by a write access phase (triggered by a first WRITE command) directed to write eight words or memory bytes b0,b1, . . . ,b7, followed by a closure and transfer phase (triggered by the second and last WRITE command setting the flag bit FG) directed to write eight words or memory bytes b8,b9, . . . ,b15, too. At the time instant t1 the memory controller 150 sends onto the memory bus 140 the first WRITE command. At the time instant t9 the memory controller 150 sends onto the memory bus 140 the second and last WRITE command, together with the FLUSH command, i.e., sends a WRITE command activating the flag bit FG. As a consequence, as soon as the last memory byte b15 is sent to the selected row register RDBi (in this case, after the time instant t18), the transfer of the content of the row register RDBi to the command window CW is started.

According to an alternative embodiment of the present invention, the flag bit FG may be a dedicated bit of the memory bus 140, i.e., not necessarily the flag bit that is used in the protocol of the DDR SDRAM memories for automatically triggering the row closure operation, or one of the available bits that are not used during the sending of the WRITE command from the address and command bus of the memory bus 140.

If the writing operation regards the updating of a single register REGj, it is sufficient to modify only a single portion of the content of the row register RDBi. Consequently, it is possible to execute the writing operation by means of a single WRITE command (particularly, said WRITE command will be sent contemporaneously to the FLUSH command).

The transfer of the content of the selected row register RDBi to the registers REGj and PB of the command window CW occurs with transfer speeds of the same order of those of a DDR SDRAM memory, since the register REGj and PB of the command window are volatile registers, that require shorts writing access times. In this way, it is possible to avoid all those problems due to the updating of the data stored in the non-volatile elements of the memory matrix 200.

According to an embodiment of the present invention, during the data transfer from the selected row register RDBi to the command window CW, every further WRITE or ACTIVE command generated by the memory controller 150 is temporarily ignored by the DDR NVM memory 130. The possibility of sending further commands to the DDR NVM memory 130 will be allowed as soon as the data transfer from the selected row register RDBi to the command window CW is concluded.

The content of the registers REGj and PB of the command window CW will be transferred into the corresponding memory elements of the memory matrix 200 in a subsequent time. This transfer occurs automatically and without the need of occupying the memory bus 140, which remains thus available for the execution of other operations.

It has to be underlined that, using the proposed solution, it is possible to carry out writing operations on the DDR NVM memory 130 treating it substantially in the same way as of a DDR SDRAM memory, i.e., using substantially the same protocol used for managing the operations of the DDR SDRAM memory 120.

Indeed, thanks to the presence of the command window CW, the times employed for writing the data into the DDR NVM memory 130 are of the same order of magnitude of those used for writing the data into the DDR SDRAM memory 120.

Moreover, the transfer of the content of the row registers RDBi towards the command window CW is driven respecting the protocol that already exists for the writing of the data into DDR SDRAM memories. Indeed, using the proposed solution, it is not necessary to use the memory bus 140 for starting the closure operation and alter the protocol, since the transfer is driven by means of the flag bit FG sent together with the WRITE command.

The command window CW may also be used during a reading operation, in case the selected row address RADD corresponds to the memory space defined by the command window. In this case, the reading operation occurs in the same way as that previously described, with the only difference that the data that have been read come from the command window CW instead of from the memory elements of the memory matrix 200.

Figure 5:
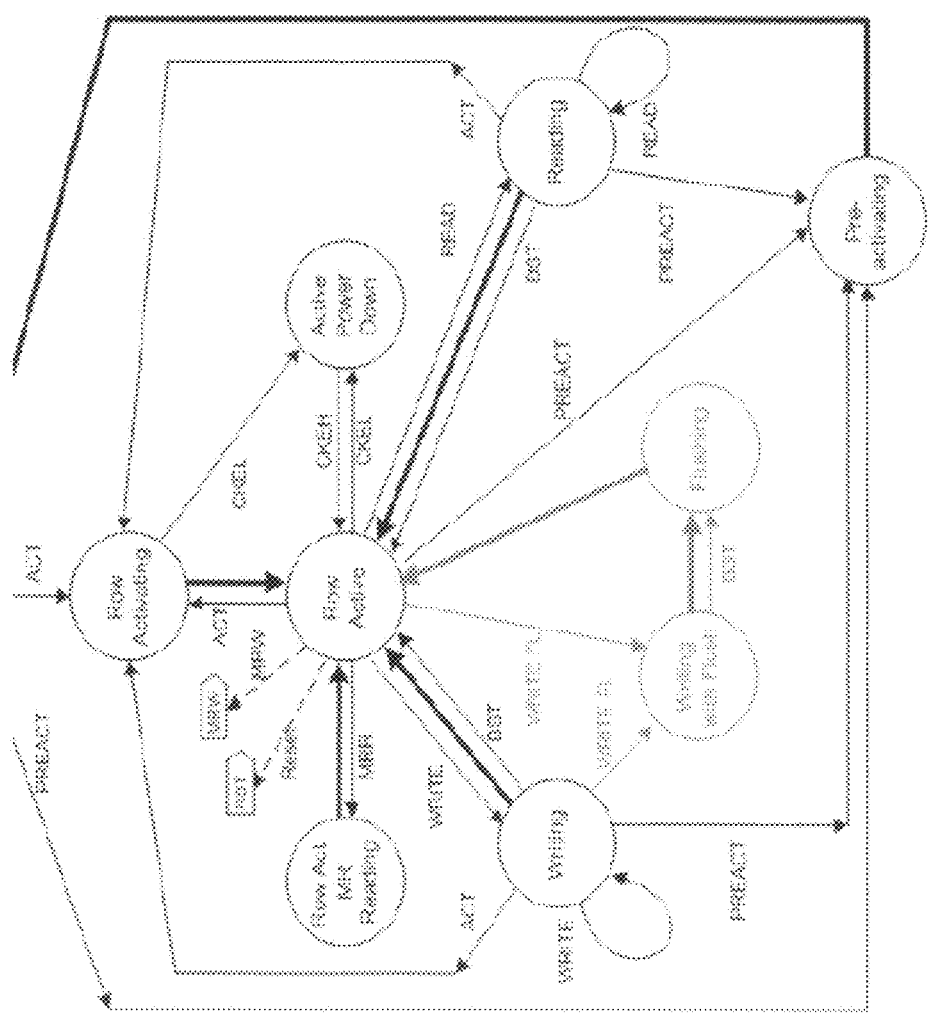
FIG. 5 illustrates a state diagram of the DDR NVM memory according to one embodiment of the present invention.

FIG. 5 illustrates a state diagram of the DDR NVM memory 130.

Figure 6:
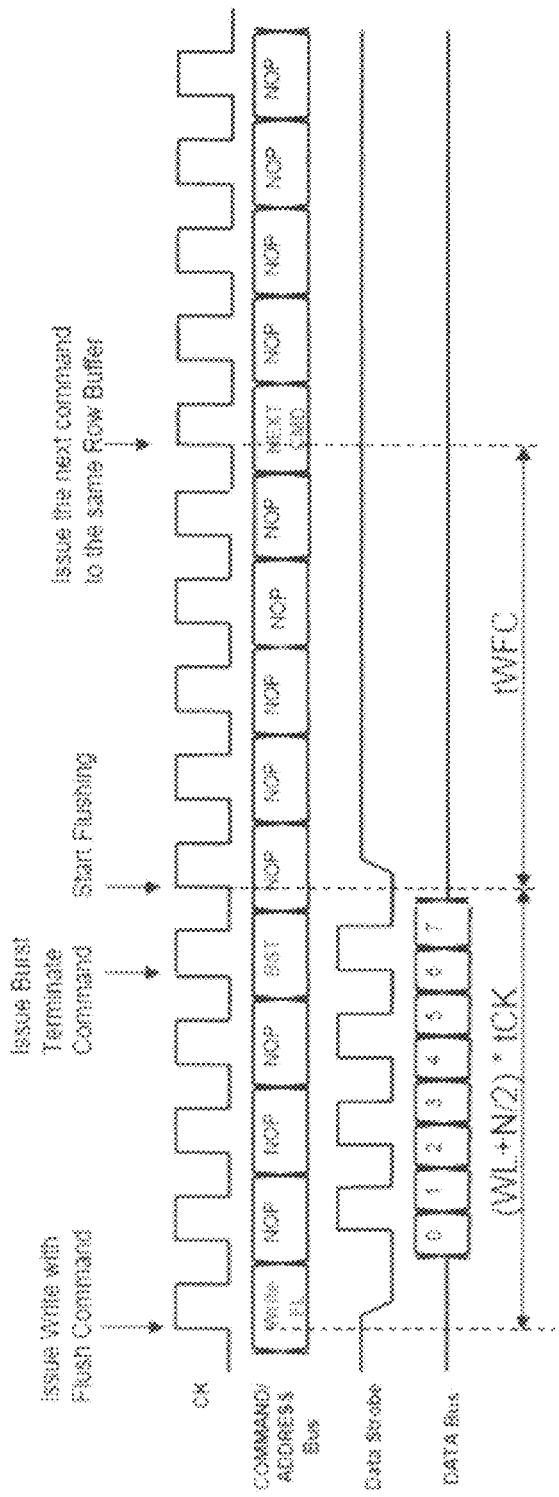
FIG. 6 is a timing diagram illustrating the delays of the commands during a write operation of the DDR NVM memory.

FIG. 6 is a timing diagram illustrative of the delays of the commands CMD during writing operations of the DDR NVM memory 130.

Naturally, in order to satisfy local and specific requirements, a person skilled in the art may apply to the solution described above many modifications and alterations. Particularly, although the present invention has been described with a certain degree of particularity with reference to the described embodiments thereof, it should be understood that various omissions, substitutions and changes in the form and details as well as other embodiments are possible. Moreover, it is expressly intended that specific elements and/or method steps described in connection with any disclosed embodiment of the invention may be incorporated in any other embodiment as a general matter of design choice.

For example, although in the description it has been explicitly made reference to a DDR NVM memory of the flash type, nothing prevents to employ the proposed solution with other types of non-volatile memories, such as EPROM, PCM and so on.

Moreover, even if the present solution has been described as adapted to be employed for devices with limited resources, such as the mobile terminals, similar considerations can be applied to any electronic system that needs both a non-volatile DDR memory and a volatile DDR memory, or other volatile and non-volatile memories having a different communications protocol.

Even if in the description reference has not been made explicitly to the specific memory bus used by the memory system, the concepts of the present invention are applicable to different bus types, like the DDR buses and the DDR2 buses mentioned herein as well as other communications protocols or bus types.

From the foregoing it will be appreciated that, although specific embodiments of the invention have been described herein for purposes of illustration, various modifications may be made without deviating from the spirit and scope of the invention.

What is claimed is:

1. A non-volatile memory device couplable with a memory bus adapted to provide data to be stored into the memory device and commands to be executed by the memory device, said memory device comprising:
    a memory matrix including memory elements adapted to memorize the data in a non-volatile way;
    at least a first buffer register configured to receive and memorize in a volatile way the data to be stored into the memory device provided by the memory bus;
    a command window activatable to operatively interpose itself, for the access to the memory matrix, between said at least one first buffer register and said memory matrix, said command window including at least one second buffer register adapted to store in a volatile way data memorized or to be memorized in a group of memory elements;
    first data transfer means adapted to execute a first transfer of the data stored in the at least one second buffer register to the at least one first buffer register during a first phase of a writing operation of the data into the memory device started by the reception of a first command;
    second data transfer means adapted to receive the data provided by the memory bus and modify, according to the received data, the data stored in the at least one first buffer register during a second phase of the writing operation of the data started by the reception of a second command,
    wherein the first transfer means are adapted to execute a second transfer of the modified data stored in the at least one first buffer register to the at least one second buffer register during a third phase of the writing operation of the data, said second transfer being executed in response to the reception of a signal received by the memory bus together with the second command.

2. The memory device of claim 1, wherein the memory elements of the memory matrix are arranged according to a plurality of rows and a plurality of columns, and a group of memory elements comprises all the memory elements of a matrix row.

3. The memory device of claim 2, wherein said at least one first buffer register is adapted to memorize the data memorizable into a group of memory elements.

4. The memory device of claim 3, wherein said second phase of the writing operation comprises at least two phases, during each one of which a respective portion of the data to be stored into the memory device is provided by the memory bus and stored into the at least one register, said signal being provided, at the start of the last of said at least two phases.

5. The memory device of claim 4, wherein:
    said at least one first buffer register comprises a first plurality of buffer registers, said first and second transfer means being adapted to select a buffer register of said first plurality during the first and second phase of the writing operation; and
    said at least one second buffer register comprises a second plurality of buffer registers, said first transfer means being adapted to select a buffer register of said first plurality during the third phase of the writing operation.

6. The memory device of claim 5, wherein said signal includes a flag bit provided together with the second command that starts the last of said at least two phases.

7. The memory device of claim 6, wherein:
    the memory elements of the memory matrix are associated with a first memory space, the memory elements of each row of the matrix being associated with a corresponding subspace of the first memory space addressable by means of a corresponding first row address;
    the second plurality of buffer registers is associated with a second memory space, each register of the second plurality being associated with a corresponding subspace of the second memory space addressable by means of a corresponding second row address.

8. The memory device of claim 7, wherein the memory bus is adapted to provide a first row address, the data to be stored into the memory device being to be stored into the memory elements of the matrix row corresponding to the first row address.

9. The memory device of claim 8, wherein the data to be stored into the memory device are stored into a corresponding buffer register of the second plurality during the first data writing phase if the second address of said buffer register of the second plurality coincides with the first row address provided by the memory bus.

10. The memory device of claim 9, wherein said memory device is adapted to be coupled to a memory bus of the DDR type.

11. The memory device of claim 9, wherein said memory device is adapted to be coupled to a memory bus of the DDR2 type.

12. An electronic system comprising:
at least one non-volatile memory device, the memory device comprising,
  a memory matrix including memory elements adapted to memorize the data in a non-volatile way;
  at least a first buffer register configured to receive and memorize in a volatile way the data to be stored into the memory device provided by the memory bus;
  a command window activatable to operatively interpose itself, for the access to the memory matrix, between said at least one first buffer register and said memory matrix, said command window including at least one second buffer register adapted to store in a volatile way data memorized or to be memorized in a group of memory elements;
  first data transfer means adapted to execute a first transfer of the data stored in the at least one second buffer register to the at least one first buffer register during a first phase of a writing operation of the data into the memory device started by the reception of a first command;
  second data transfer means adapted to receive the data provided by the memory bus and modify, according to the received data, the data stored in the at least one first buffer register during a second phase of the writing operation of the data started by the reception of a second command, wherein the first transfer means are adapted to execute a second transfer of the modified data stored in the at least one first buffer register to the at least one second buffer register during a third phase of the writing operation of the data, said second transfer being executed in response to the reception of a signal received by the memory bus together with the second command;
at least one volatile memory device; and
a memory controller coupled with the non-volatile memory device and with the volatile memory device by means of the memory bus, said memory controller being adapted to provide data to be stored or receive data stored in the non-volatile memory device or in the volatile memory device, respectively.

13. A method of storing data in a non-volatile memory device, the method comprising:
receiving and storing data in at least one first buffer register;
activating a command window interposed between the at least one first buffer register and the non-volatile memory device;
receiving a first command;
in response to the first command, executing a first transfer of data stored in at least one second buffer register to the at least one first buffer register during a first phase of a writing operation of the data into the non-volatile memory;
receiving a second command; and
in response to the second command, modifying the data stored in the at least one first buffer register during a second phase of the writing operation.

14. The method of claim 13, further comprising selecting the at least one first buffer register and the at least one second buffer register to comprise volatile memory devices thereby allowing the data to be written with a granularity of bytes.

15. The method of claim 13, further comprising setting a base address of the command window.

16. The method of claim 15, wherein the base address corresponds to a particular row address of the non-volatile memory device for which the command window overlaps the non-volatile memory device.

17. The method of claim 15, further comprising selecting the base address to overlap different portions of the non-volatile memory device.

18. A method of storing data in a non-volatile memory device, the method comprising:
receiving and storing data in at least one volatile first buffer register;
activating a command window interposed between the at least one first volatile buffer register and the non-volatile memory device;
executing a first transfer of data stored in at least one second volatile buffer register located within the command window to the at least one first volatile buffer register during a first phase of a writing operation of the data into the non-volatile memory upon the receiving of a first command; and
modifying the data stored in the at least one first volatile buffer register during a second phase of the writing operation upon the receiving of a second command.

19. The method of claim 18, further comprising transferring the data from the at least one second volatile buffer register to the non-volatile memory device during a subsequent operation.

20. The method of claim 18, further comprising executing a second transfer of the modified data stored in the at least one first volatile buffer register to the at least one second volatile buffer register during a third phase of the writing operation of the data in response to receiving a signal.

* * * * *